US008884743B2

(12) United States Patent
Chaffey et al.

(10) Patent No.: US 8,884,743 B2
(45) Date of Patent: Nov. 11, 2014

(54) RFID MEMORY DEVICES

(75) Inventors: Jason Chaffey, Box Hill South (AU);
Adam Dickson, Heidelberg (AU)

(73) Assignee: Bluechiip Pty Ltd (AU)

( * ) Notice: Subject to any disclaimer, the term of this patent is extended or adjusted under 35 U.S.C. 154(b) by 823 days.

(21) Appl. No.: 13/000,586

(22) PCT Filed: Jun. 19, 2009

(86) PCT No.: PCT/AU2009/000783
§ 371 (c)(1),
(2), (4) Date: Apr. 1, 2011

(87) PCT Pub. No.: WO2009/155638
PCT Pub. Date: Dec. 30, 2009

(65) Prior Publication Data
US 2011/0175708 A1    Jul. 21, 2011

Related U.S. Application Data

(60) Provisional application No. 61/129,441, filed on Jun. 26, 2008.

(51) Int. Cl.
| G06K 19/06 | (2006.01) |
| H04Q 5/22 | (2006.01) |
| G08B 13/14 | (2006.01) |
| G11C 11/20 | (2006.01) |
| G06K 19/067 | (2006.01) |

(52) U.S. Cl.
CPC ............ G11C 11/20 (2013.01); G06K 19/0672 (2013.01)
USPC ... 340/10.1; 340/10.3; 340/572.2; 340/572.7; 235/492

(58) Field of Classification Search
None
See application file for complete search history.

(56) References Cited

U.S. PATENT DOCUMENTS

| 4,114,164 | A * | 9/1978 | Greiser ........................ 343/895 |
| 6,373,388 | B1* | 4/2002 | Dames ....................... 340/572.2 |
| 7,439,935 | B1* | 10/2008 | Rodenbeck .................. 343/895 |
| 2003/0057278 | A1* | 3/2003 | Wong ........................... 235/451 |
| 2003/0112186 | A1* | 6/2003 | Sanchez et al. ........ 343/700 MS |
| 2006/0151613 | A1* | 7/2006 | Zmood ........................ 235/492 |
| 2008/0204324 | A1* | 8/2008 | Okamura et al. ...... 343/700 MS |
| 2009/0174557 | A1* | 7/2009 | Nikitin et al. ............. 340/572.7 |

FOREIGN PATENT DOCUMENTS

| WO | 2004084131 | 9/2004 |
| WO | 2006076037 | 7/2006 |
| WO | 2008032313 A1 | 3/2008 |

* cited by examiner

Primary Examiner — George Bugg
Assistant Examiner — Renee Dorsey

(57) ABSTRACT

An RFID memory device includes two arrays of resonant members. A first array extends in a first member direction and a second array extends in a second member direction. The device includes one or more elements for transforming energy associated with vibration of the resonant members into a change in impedance of an electrical equivalent circuit of the memory device. The magnitude of impedance change caused by resonance of the first resonant members is maximized at a different magnetic field direction to that at which the magnitude of the impedance change caused by resonance of the second resonant members is maximized. Thus, different data may be encoded on each array and separately read. The resonant members may form part of a common electrical conductor that forms a coupling element for coupling with an applied excitation signal and causing vibration of the resonant members.

36 Claims, 13 Drawing Sheets

RFID MEMORY DEVICES

TECHNICAL FIELD

The present invention relates to RFID memory devices, interrogators for interrogating RFID memory devices and systems and methods using the RFID memory devices and interrogators.

BACKGROUND

RFID systems typically include RFID memory devices and RFID readers (the latter are also known as RFID reader/writers or RFID interrogators). RFID systems can be used in many ways for locating and identifying objects to which the memory devices are attached. RFID systems are particularly useful for tracking large numbers of objects being processed, inventoried, or handled. In such cases, an RFID memory device is usually attached to an individual item, or to its package.

In principle, an RFID interrogator transmits a Radio Frequency (RF) wave to one or more RFID memory devices. A memory device that senses the interrogating RF wave responds by transmitting back another RF wave. The memory device generates the transmitted back RF wave either originally, or by reflecting back a portion of the interrogating RF wave in a process known as backscatter. Backscatter may take place in a number of ways. The reflected-back RF wave may further encode data stored internally in the memory device, such as a number. The response is demodulated and decoded by the reader, which thereby identifies, counts, or otherwise interacts with the associated item. The decoded data can denote a serial number, a price, a date, a destination, other attribute(s), any combination of attributes, and so on.

An RFID memory device typically includes an antenna system, a power management section, a radio section, and frequently a logical section, a memory, or both. In earlier RFID memory devices, the power management section included an energy storage device, such as a battery. RFID memory devices with an energy storage device are known as active tags. Advances in semiconductor technology have miniaturized the electronics so much that an RFID memory device can be powered solely by the RF signal it receives. Such RFID memory devices do not include an energy storage device, and are called passive tags.

International Patent Applications WO 2004/084131 and WO 2004/083798 both describe passive RFID memory devices that utilize arrays of vibrating members to encode data. These members may take the form of cantilever and bridge structures, and may have different resonant frequencies from one another so that the presence or absence of a vibrating member of a particular frequency may be equated to a logical "1" or "0", and may represent binary code, a status flag or the like. A determination of the presence or absence of a member may be made by applying an excitation signal to the array and by analysing the response to determine if it is indicative of a particular member's resonant frequency. The arrays may be fabricated using MEMS technology (microelectromechanical systems technology), which is also known as MST (Micro System Technology) and micromachining. MEMS technology includes fabrication technologies for integrated circuits, and technologies specifically developed for micromachining. It generally relates to the fabrication of components with dimensions in the range of micrometers to millimeters.

Each such RFID memory device includes electrically or electronically active elements to electrodynamically couple the motion of the vibrating member and an external interrogation circuit. One electrodynamic interaction which may be employed in a RFID tag is Lorentz force/Faraday induction. A conductor runs along or through the vibrating members and extends beyond the vibrating members on the RFID memory device to electrical terminals. A coil antenna interconnects the terminals. The vibrating member is located in a region of non-zero magnetic field. An alternating electrical current is induced in the coil antenna (and hence the conductor) by a corresponding coil in the interrogation circuit. The lines of this magnetic field are so oriented that a Lorentz force associated with the alternating electrical current flowing through the conductor tends to displace the vibrating members from an equilibrium position.

The energy associated with movement and displacement of the vibrating member, as well as other energy storage mechanisms such as electrostatic energy, will be manifest between the electrical terminals in the RFID memory device as relationships between terminal voltages and currents. These relationships can be expressed as an equivalent electrical circuit. Such equivalent circuits will include inductive or capacitive elements. In addition, mechanical resonances of a vibrating member are typically damped by a number of mechanisms including intrinsic causes such as visco-elastic and thermo-elastic loss. Such losses also manifest in the equivalent electrical circuit as resistive elements.

Each vibrating member is fabricated to have a distinct resonant frequency. When the frequency of the applied alternating electrical current corresponds to the resonant frequency of a particular vibrating member, that member is caused to mechanically resonate. The oscillating motion of the beam in a magnetic field causes by Faraday Induction an electromotive force in the circuit consisting of the conductive path through or comprising the resonators and the components attached to these, including an electromagnetic coupling. An oscillating electromagnetic signal is therefore transmitted back the external interrogation circuit. This additional contribution of electromotive force can be interpreted as a increment in impedance, as the ratio of the electromotive force to the current passing through the beam.

An RFID memory device may have the property that the magnitude of the impedance change caused by the mechanical resonance of a particular vibrating member is much smaller that the "background" impedance directly associated with the electrical elements of the equivalent electrical circuit within the RFID memory device. In the case of Lorentz force/Faraday induction based coupling, for typical configurations, the resonant impedance change is several orders of magnitude smaller than the background impedance, namely the ohmic resistance of the beam conductors and electrical interconnections. A technique for resolving the impedance change caused by the mechanical resonance of a particular vibrating member is described in copending U.S. provisional patent application entitled "Ringup/Ringdown Interrogation of RFID tags" filed on 3 Oct. 2008 to the present Applicant.

It would be desirable to provide an alternate memory device and interrogation method that has advantages over existing RFID memory devices and interrogation methods.

The above discussion of background art is included to explain the context of the present invention. It is not to be taken as an admission that any of the documents or other material referred to was published, known or part of the common general knowledge at the priority date of any one of the claims of this specification.

DISCLOSURE OF THE INVENTION

One aspect of the invention provides a memory device including: a first array of one or more first resonant members extending in a first member direction;

a second array of one or more second resonant members extending in a second member direction; and one or more elements for transforming energy associated with vibration of the first and second resonant members into a change in impedance of an electrical equivalent circuit of the memory device, such that the magnitude of the impedance change caused by resonance of the first resonant members is maximised at a different magnetic field direction to that at which the magnitude of the impedance change caused by resonance of the second resonant members is maximised.

In one or more embodiments of the invention, the one or more elements include first conductor portions each extending along the length of a first resonant member and second conductor portion extending along the length of the second resonant member. One or more of the first and second conductor portions may be integral with one or more of the first and second resonant members. Alternatively, one or more of the first and second conductor portions are formed on one or more of the first and second resonant members.

The resonant members may be vibratable by application of a Lorentz force. However, other techniques may also be used to excite the resonant members, such as the use of piezoelectric device affixed to the resonant members to cause vibration of the resonant members upon application of an alternating voltage to the piezoelectric device. The motion of the resonant member can be detected by Faraday Induction, or by Magneto-resistance and related phenomena.

In one or more embodiments of the invention, the first member direction and second member direction are non-collinear. Conveniently, the first member direction and second member direction may be orthogonal to each other.

The first resonant members may encode the same or different data to the second resonant members.

The one or more elements may form part of a common electrical conductor connected to a coupling element for coupling with the applied excitation signal. The one or more elements may form part of a coupling element for coupling with the applied excitation signal.

The memory device may be fabricated using MEMS or CMOS technology.

The first and second resonant members and the common electrical conductor may be formed on the same dielectric or semiconductor substrate. A coupling element for coupling with the applied excitation signal may also be formed on the same dielectric or semiconductor substrate.

A first group of one or more first and/or second resonant members have resonant frequencies within a first frequency range; and a second group of one or more first and/or second resonant members have resonant frequencies within a second frequency range. The first group could encode different data than the second group, or alternatively the first group could encode the same data as the second group. The first frequency range and the second frequency range may be non-overlapping in different embodiments, or alternatively may be at least partially overlapping.

Another aspect of the invention provides a memory device including an array of resonant members adapted to vibrate in response to an applied excitation signal in order to represent data, wherein a first group of one or more of the resonant members have resonant frequencies within a first frequency range; and a second group of one or more of the resonant members have resonant frequencies within a second frequency range, the first group encoding different data than the second group.

Yet another aspect of the invention provides a memory device including an array of resonant members adapted to vibrate in response to an applied excitation signal in order to represent data, wherein the resonant members form part of a common electrical conductor that forms a coupling element for coupling with an applied excitation signal and causing vibration of the resonant members.

The above-described memory devices may be fabricated using MEMS or CMOS technology. Conveniently, the resonant members and electrical conductor are formed on the same dielectric or semiconductor substrate. The resonant members may be vibratable by application of a Lorentz force.

Yet another aspect of the invention provides an interrogator for interrogating the above-described memory device. The interrogator includes:

a signal generator for applying an excitation signal to the memory device;

a magnetic field generator for applying a magnetic field across the resonant members; and a receiver for receiving a response to the excitation signal and for analysing the response in order to detect changes in a magnitude indicative of the vibration of the resonant members of the memory device.

In one or more embodiments, the magnetic field generator includes one or more electromagnets for applying the magnetic field. The electromagnet may be configured to apply a magnetic field in different directions. Alternatively, the magnetic field generator may include one or more permanent magnets and/or soft magnets for applying the magnetic field. In this case, the one or more permanent magnets may be rotatable so as to apply a magnetic field in different calibration directions.

In embodiments in which the magnetic field generator includes an permanent magnet, the permanent magnet may have an annular shape.

The interrogator may include a recess in which an item including the memory device is positioned for reading the memory device. The recess and item may be shaped such that the item fits into the recess in one orientation only. The recess and item may alternatively be shaped such that the item fits into the recess in two, three or four, or a greater number of orientations.

Yet another aspect of the invention provides a data reading system including the above-described memory device and interrogator A further aspect of the invention provides a method of reading data recorded on the above-described memory device, including the steps of:

applying a magnetic field across the resonant members in a first magnetic field direction;

applying at least a first excitation signal to the memory device;

receiving at least a first response to the first excitation signal, and analysing the first response in order to detect changes in the impedance of the electrical equivalent circuit of the memory device.

In one or more embodiments, the method includes the steps of:

applying a magnetic field across the resonant members in a second magnetic field direction;

applying at least a second excitation signals to the memory device;

receiving at least a second response to the second excitation signal, and analysing the second response in order to detect changes in the impedance of the electrical equivalent circuit of the memory device.

A still further aspect of the invention provides a method of reading data recorded on the memory device, the memory device including N arrays of one or more resonant members, the resonant members in each array extending in a common direction which is different from the common direction in which resonant members in other arrays extend, the method including the steps of:

(a) for each of at least N+1 calibration directions in a plane containing the resonant members:
  (i) applying a magnetic field across the resonant members in that direction,
  (ii) applying at least a first excitation signal to the memory device,
  (iii) receiving at least a first response to the excitation signal, and
  (iv) analysing the response in order to detect changes in the impedance of the electrical equivalent circuit of the memory device,
(b) determining the angular offset between a first calibration direction and the common direction of a first array from the detected changes in impedance, and
(c) re-orienting the magnetic field so as to selectively read data encoded in one of the resonant arrays.

In one of more embodiments, there are two arrays of resonant members and the calibration directions include a first calibration direction, a second calibration direction orthogonal to the first calibration direction and a third calibration direction bisecting an angle between the first and second calibration directions.

Conveniently, one or more resonant members in each array may be reference members having a resonant frequency within one of a range of selected frequency bands.

At least one resonant member in each of the N arrays of resonant members may have a resonant frequency within a different selected frequency band.

One of the first resonant members and one of the second resonant members may be reference members and each of these resonant members may have a resonant frequency within a different selected frequency band.

For each resonant member that is a reference member, there may be one or more resonant members extending in the same member direction as the reference member within a second predefined frequency band.

A still further aspect of the invention provides a method of reading data recorded on the memory device, the memory device including N arrays of one or more resonant members, the resonant members in each array extending in a common direction which is different from the common direction in which resonant members in other arrays extend, the method including the steps of:

(a) for each of at least N+1 calibration directions in a plane containing the resonant members:
  (i) applying a magnetic field across the resonant members in that direction,
  (ii) applying at least a first excitation signal to the memory device,
  (iii) receiving at least a first response to the excitation signal, and
  (iv) analysing the response in order to detect changes in the impedance of the electrical equivalent circuit of the memory device,
(b) computing the impedance change caused by resonant members in each array, when the magnetic field is oriented perpendicularly to the common direction in which those resonant members extend, from the detected changes in impedance.

It should be noted that any of the features of any of the above aspects or embodiments may be applied to any of the other aspects or embodiments.

Embodiments of the present invention will now be described, by way of example only, with reference to the accompanying drawings. It is to be understood that the particularity of the drawings does not supersede the generality of the preceding description of the invention.

DETAILED DESCRIPTION OF THE INVENTION

Figure 1:
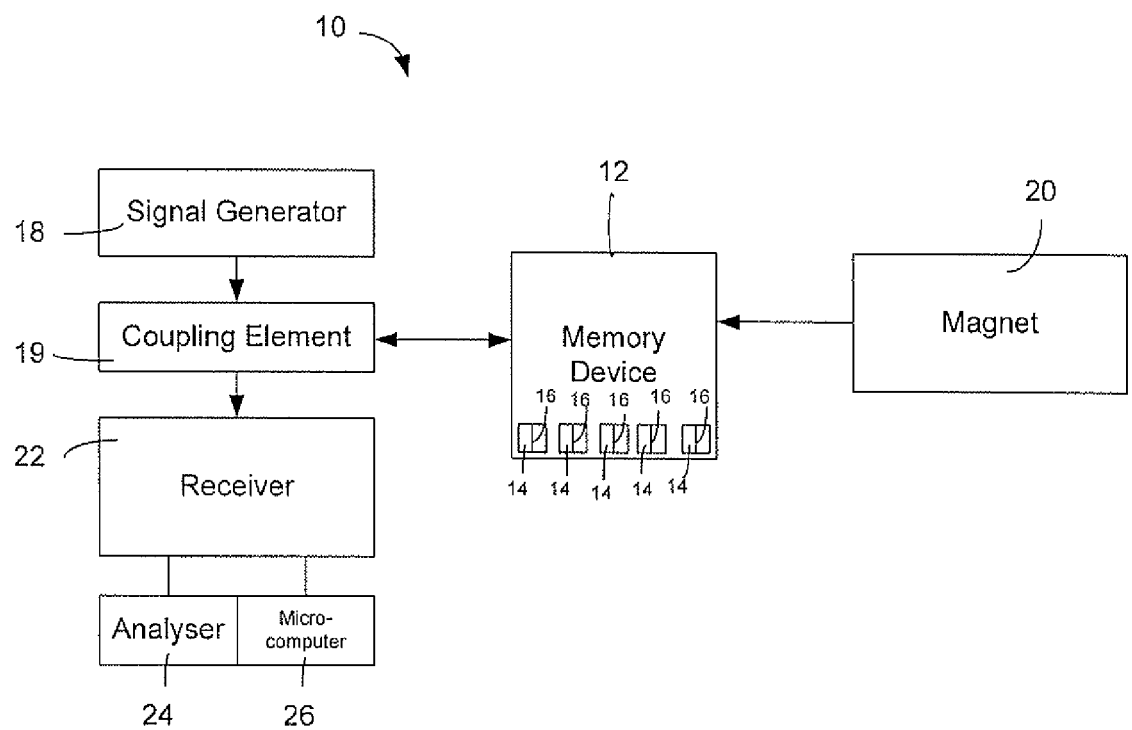
FIG. 1 is a schematic diagram of a data storage system that may be implemented using the present invention.

Referring to FIG. 1, a data reading system 10 includes a memory device 12 that may be attached to an item to provide information about the item. The memory device 12 includes a plurality of resonant members 14 of a bridge-type structure having different resonant frequencies, and conductor portions 16 extending along the length of the resonant members 14. Bridge-type structure resonant members are, for example, beams that are attached/held against movement at both ends. The presence or absence of a resonant member 14 at a particular resonant frequency represents a binary digit.

The data reading system 10 also includes a signal generator 18 that includes a coupling element 19 for electrodynamically coupling the signal generator to the memory device 12 in order to apply an excitation signal to the memory device 12. and the system 10 also includes a magnetic field generator 20 for applying a magnetic field across the resonant members 14. The magnetic field generator 20 may include one or more permanent magnets or one or more electromagnets. A receiver 22 receives a response to the excitation signal via the coupling element 19. An analyser 24 and micro-computer 26 analyses the response and detects changes in the impedance of the electrical equivalent circuit of the memory device 12.

Figure 2:
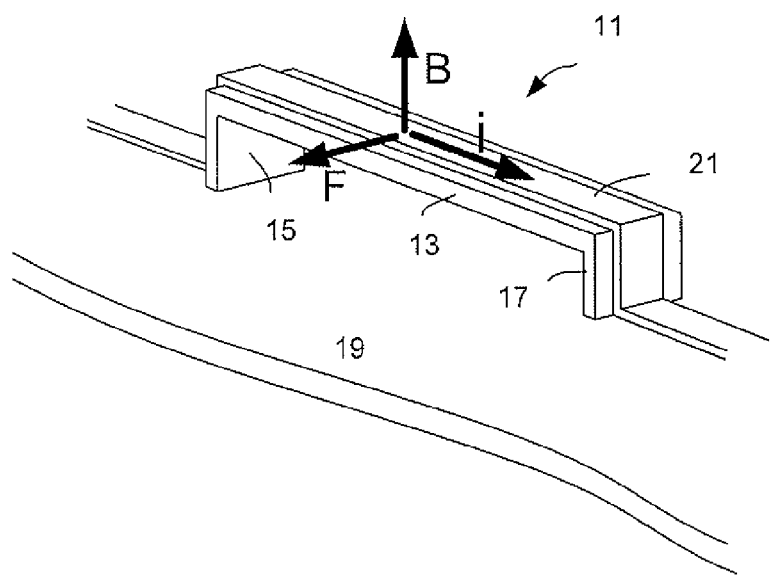
FIGS. 2 and 3 are isometric views of two embodiments of a resonant member forming part of a memory device forming part of the system shown in FIG. 1.

FIG. 2 depicts an exemplary resonant member in the bridge-type structure 11 including a beam 13 supported by two columns 15 and 17 projecting from a substrate 19. The structure shown in FIG. 2 may be formed by conventional semi-conductor fabrication techniques involving the use of known etching and electro-deposition processes. Once the bridge structure 11 has been formed on the substrate 19, an electrically conductive path 21 is then electro-deposited along the length of the structure 13. The conductor portions 16 form part of the electrically conductive path 21.

When an interrogation signal is applied to the memory device 12, alternating electrical current is induced in the coupling element 19 which thus causes the flow of electrical current through the conductive path 21. In the presence of an orthogonal magnetic field, a force is then applied to the beam 13 in a direction that is orthogonal to both the direction of current flow and the magnetic field direction. Since the current in the conductor 21 is an alternating current, the orthogonal force generated is also an alternating force, resulting in the vibration of the beam 13. If the frequency of the alternating current in the conductor 21 is at or near the resonant frequency of the beam 13, the beam 13 will vibrate.

Figure 3:
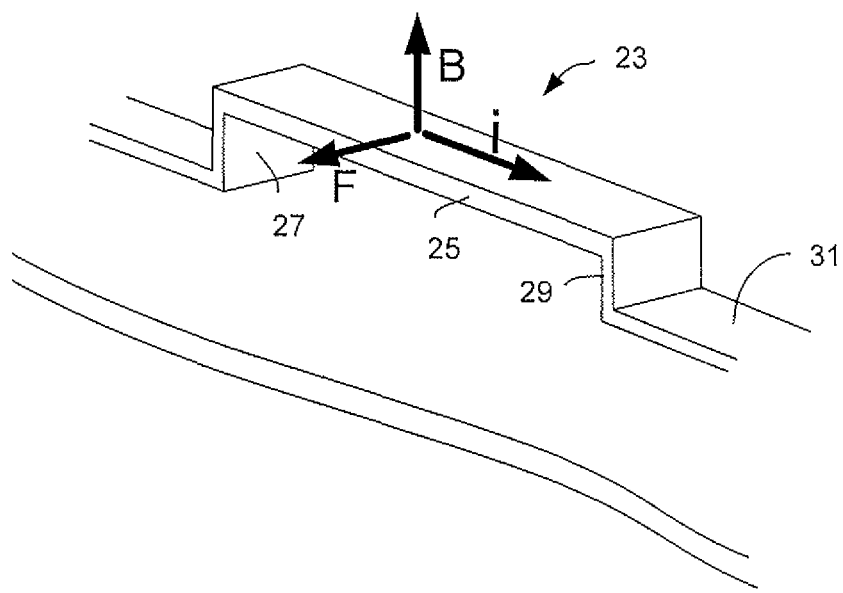

Another exemplary vibratable member is shown in FIG. 3. In this case, the resonant member is in the bridge-type structure 23 includes a beam 25 supported by two columns 27 and 29. Unlike the embodiment depicted in FIG. 2 though, the beam 25 is formed from the same material as the electrically conductive path 31 supporting the two columns 27 and 29. It will be appreciated that in this embodiment, the conductor portions 16 shown in FIG. 1 are integral to the beam 25 rather than being deposited or otherwise formed on top of the beam 13 of FIG. 2. The structure shown in FIG. 3 may be formed by conventional semi-conductor fabrication techniques involving the use of known etching and electro-deposition processes. Typically, the electrically conductive path 31, columns 27 and 29 and beam 25 are deposited on the substrate 65 in the same deposition step(s).

The signal generator 18 may use a ring-up/down interrogation technique to interrogate the memory device 12. Such a technique is described in co-pending U.S. provisional application entitled "Ringup/Ringdown Interrogation of RFID tags" filed on 3 Oct. 2008 to the present Applicant. In this technique, the signal generator 18 applies an electrical stimulus of appropriate bandwidth to the memory device 12. One or more of the resonant members 14 in the memory device 12 can respond and absorb some amount of energy from the electrical stimulus, holding it in mechanical form ("ring-up"). This stimulus is then reduced to zero, and the electrical response appearing across the terminals of the memory device 12 then recorded ("ring-down") by the receiver 22. The response will consist of contributions from all those resonant members 14 that absorbed energy from the stimulus phase, but will consist of none from the non-energy storing elements (such as the interconnection ohmic resistance).

The conductor portions act as elements for transforming energy associated with vibration of the first and second resonant members into a change in impedance of an electrical equivalent circuit of the memory device. In this way, the background impedance directly associated with the electrical elements of the equivalent electrical circuit within the memory device 12 is removed and the impedance change caused by the mechanical response of a particular resonant member 14 is detected.

Figure 4:
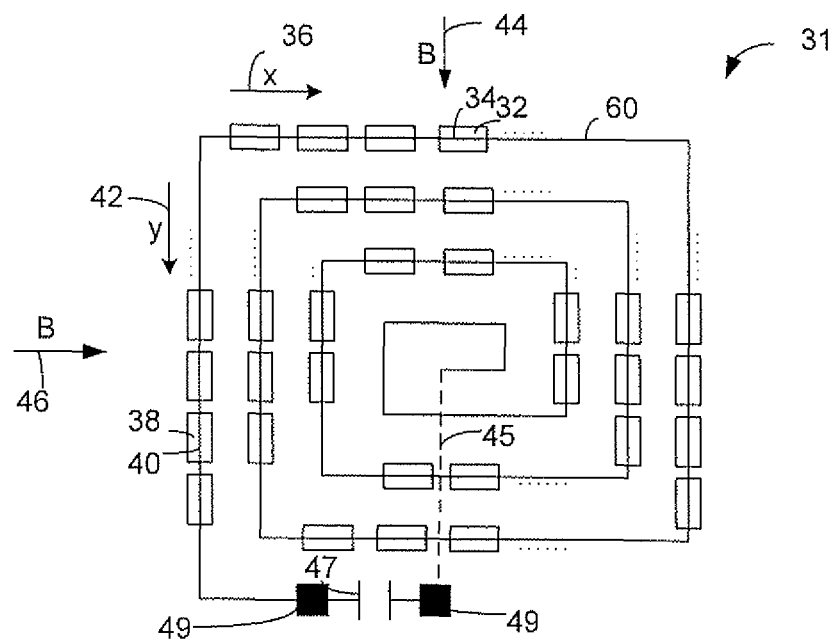
FIG. 4 is a schematic view of a memory device having orthogonal resonant members encoded with different data.

FIG. 4 shows a memory device 31 for storing two different sets of data according to one embodiment of the invention. The memory device 31 includes a first array of first resonant members 32, each first resonant member 32 having a first conductor portion 34 extending along the length of the first resonant member 32 in a first member direction 36. The memory device 31 also includes a second array of second resonant members 38, each second resonant member 38 having a second conductor portion 40 extending along the length of the second resonant member 38 in a second member direction 42.

The first resonant members 32 and second resonant members 38 are orthogonal to each other and different sets of data are stored on the first resonant members 32 and the second resonant members 38. For example, the first resonant members 32 may have different resonant frequencies from one another, and the second resonant members 38 may have different resonant frequencies from one another. The resonant frequencies of some or all of the first and second resonant members may be duplicated or distinct.

Data stored on only the first resonant members 32 can be read by orienting the memory device 31 and magnetic field generator 20 so that a magnetic field 44 acts perpendicular to the first member direction 36. With the magnetic field 44 oriented in this direction, the mechanical response (re vibration) of first resonant members 32 to the electrical stimulus will be maximised, whereas the mechanical response of the second resonant members 38, will be negligible. Accordingly, the impedance change caused by the mechanical response of the first resonance members 32 will be maximised.

Similarly, data stored on only the second resonant members 38 can be read by orienting the magnetic field generator 20 so that a magnetic field 46 acts perpendicular to the second member direction 42. With the magnetic field 46 oriented in this direction, the mechanical response of the second resonant members 38 to the electrical stimulus will be maximised, but not the mechanical response of the first resonant members 32 will be negligible.

Figure 5:
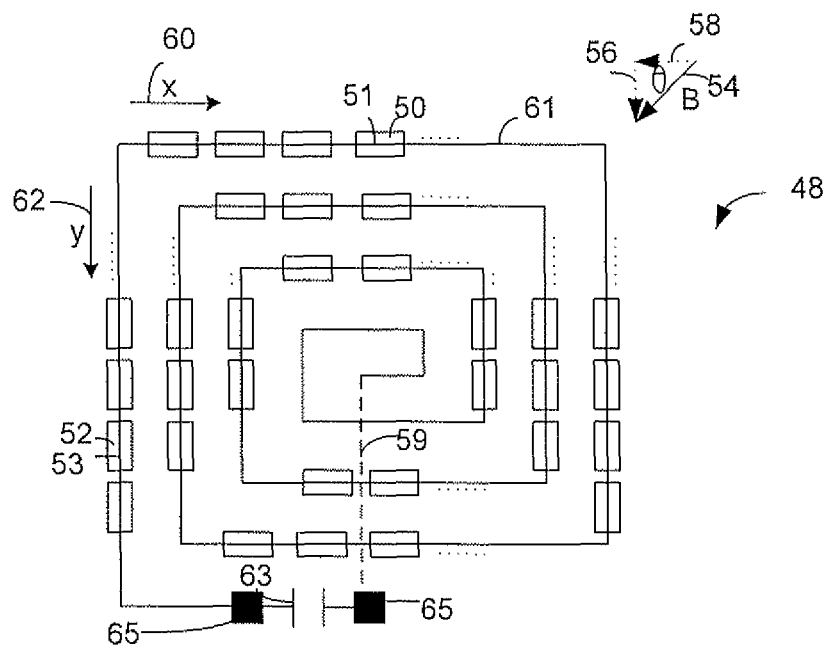
FIG. 5 is a schematic view of a memory device having orthogonal resonant members encoded with the same data.

FIG. 5 shows a memory device 48 storing only a single set of data according to another embodiment of the invention. In this embodiment, there are an equal number of first and second resonant members 50 and 52. Each first resonant member 50 has a particular resonant frequency and has a corresponding second resonant member 52 having the same resonant frequency.

The data stored on the memory device 48 can be read with any orientation of magnetic field across the resonant members. The memory device 48 in FIG. 5 is shown subject to an applied magnetic field 54 having components 56 and 58, which are perpendicular to a first member direction 60 and a second member direction 62 respectively. The detected change in impedance of the electrical equivalent circuit of the memory device results from the mechanical response of both the conductor portions 51 and 53.

Figure 6:
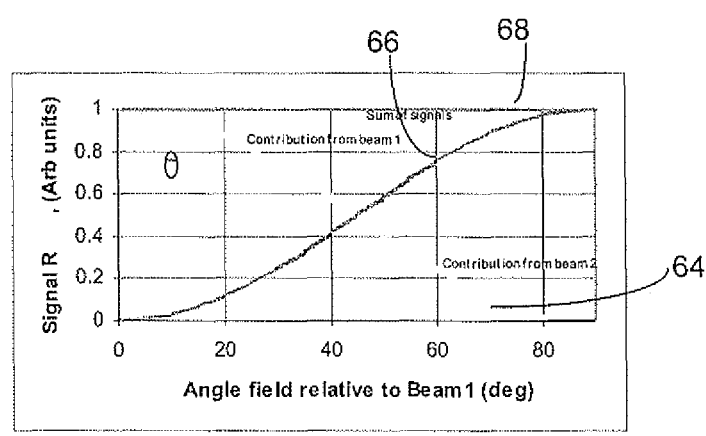
FIG. 6 is a graph representing the angle of the magnetic field relative to a first member direction, the resulting resistance of the first and second resonant members and the summed total resistance of the memory device at a given frequency.

Referring to FIG. 6, when the magnetic field 54 is applied in the first member direction 60 and an excitation signal corresponding to a particular frequency is applied to the memory device 48, the impedance contribution 64 resulting from the mechanical response of the second resonant member 52 having a resonant frequency corresponding to that particular frequency is maximised (1). The impedance contribution resulting from the mechanical response of 66 of the first resonant member 50 with the same resonant frequency is minimised (0). As the angle of the magnetic field 54 relative to the first member direction 60 is increased, the impedance contribution 64 associated with the second resonant member 52 decreases and the impedance contribution 66 associated with the first resonant member 50 increases, until the magnetic field 54 is applied perpendicular to the first member direction 60, i.e. in the second member direction 62. At this stage, the impedance contribution 66 associated with the first resonant member 50 is maximised (1) and the impedance contribution 64 associated with the second resonant member 52 is minimised (0).

The impedance contribution associated with a resonant member at its resonant frequency is proportional to $\cos^2 \theta$ where $\theta$ is the angle between the longitudinal axis of the resonant member and the direction of the magnetic field. The resistance associated with a bridge-type resonant member at its resonant frequency can be approximated according to the formula:

$$R = \frac{0.69 \times (B \cdot \cos\theta)^2 \times L \times Q}{\rho \times A \times \omega}$$

where B is the magnetic field strength, $\theta$ is the angle between the longitudinal axis of the resonant member and the direction of the magnetic field, L is the length of the resonant member, Q is the quality factor, $\rho$ is the density of the resonant member, A is the cross sectional area of the resonant member and $\omega$ is the resonant frequency multiplied by $2 \times \pi$. This approximation is based on an ideal model using the Bernoulli-Euler beam equation for a fixed-fixed (i.e. bridge-type) beam.

As the frequency of the alternating current deviates from the resonant frequency of a particular resonant member, the impedance contribution associated with the resonant member drops away to a base value.

In this embodiment a maximised (1) total impedance contribution resistance 68 of the memory device 48 at a particular resonant frequency is detected regardless of the magnetic field direction being the sum of the resistance contribution 66 and 64 associated with the first and second resonant members 50 and 52.

Another feature of the memory devices 31 and 48 of FIGS. 4 and 5 is that the conductor portions 34 and 40, and 51 and 53 associated with the first and second resonant members 32 and 38, and 50 and 52 respectively form part of a common electrical conductor 60 and 61 that extends along the lengths of the first and second resonant members 32 and 38, and 50 and 52 and also forms part of excitation circuitry for coupling with the applied excitation signal. The common electrical conductors 60 and 61 form a closed circuit, with the dotted lines 45 and 59 representing the part of the conductors 60 and 61 that extend underneath other parts of the common electrical conductor 60 and 61. As has been explained in relation to FIGS. 2 and 3, the conductor portions may be integral with, or formed on, the resonant members.

In the memory devices 31 and 48 of FIGS. 4 and 5, the conductor portions form part of a coupling element for electrodynamically coupling the motion of the resonant members to the external signal generator and receiver. In this example, the coupling element forms an antenna coil or transformer winding in which alternating current which electromagnetically interacts with a corresponding winding or coil in the signal generator and receiver. The coupling element takes a square spiral form in this example.

Figure 7:
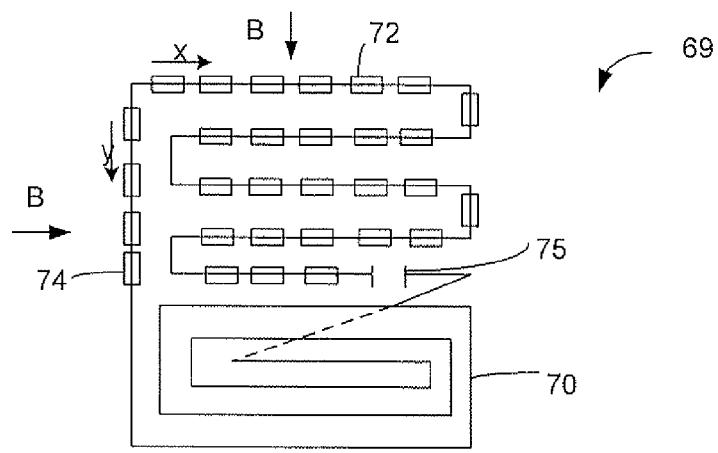
FIG. 7 is a schematic view of a memory device having orthogonal resonant members encoded with different data and a separate antenna.
Figure 8:
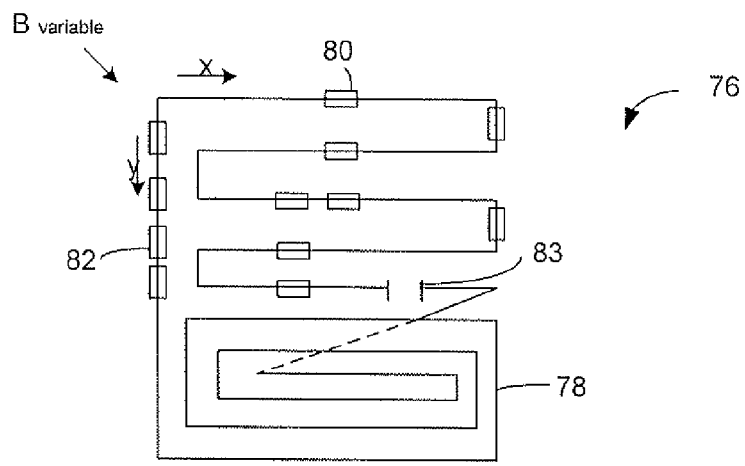
FIG. 8 is a schematic view of a memory device having orthogonal resonant members encoded with the same data and a separate antenna.

However, in other embodiments the conductor portions need not form part of an coupling element. FIG. 7 shows a memory device 69 having a coupling element 70 and orthogonal first and second resonant members 72 and 74 storing different data sets, whilst FIG. 8 shows a memory device 76 having a coupling element 78 and orthogonal first and second resonant members 80 and 82 storing the same data set. In both cases, the conductor portions and the coupling element are formed in separate parts of the common electrical conductor.

Yet another feature of the memory devices 31, 48, 69 and 76 is a capacitor 47, 63, 75 and 83, provided in series with the resonant members and coupling element of the memory devices. The capacitor forms an LRC series circuit with the coupling element and resonant members. In the arrangements shown in FIGS. 4 and 5, the capacitor is shown connected between two bonding pads 49 and 65 respectively. The capacitance of this capacitor is selected in order to ensure that the resonant frequency of created LRC circuit is in the middle of the resonant members' frequency bandwidth.

Figure 9:
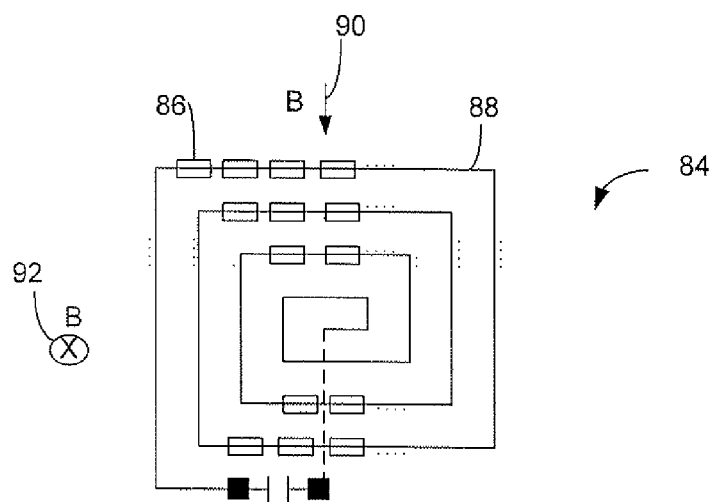
FIG. 9 is a schematic view of a memory device having resonant members on a common electrical conductor which forms an antenna.

FIG. 9 shows another memory device 84 which includes an array of resonant members 86 extending in a single direction only. A common electrical conductor 88 extends along the lengths of the resonant members 86 and forms both conductor portions along the resonant members and a coupling element for coupling with an applied excitation signal. In this example, the resonant members 86 are vibratable by a Lorentz force. A magnetic field 90 or 92 can be applied in a direction perpendicular to the direction of the resonant members 86, so that an applied excitation signal can induce an alternating current in the common electrical conductor 88 and thus cause a mechanical response to the excitation signal in the resonant members 86.

However, in other embodiments, the resonant members 86 may alternatively be vibratable by other means, such as an electrostatic or piezoelectric force.

The memory devices of FIGS. 4 to 9 could include resonant members having resonant frequencies in different frequency ranges such that different data can be encoded on the memory device within these different frequency ranges. To that end, the memory device may include a first group of resonant members may have resonant frequencies within a first frequency range and a second group of resonant members may have resonant frequencies within a second frequency range.

Figure 10:
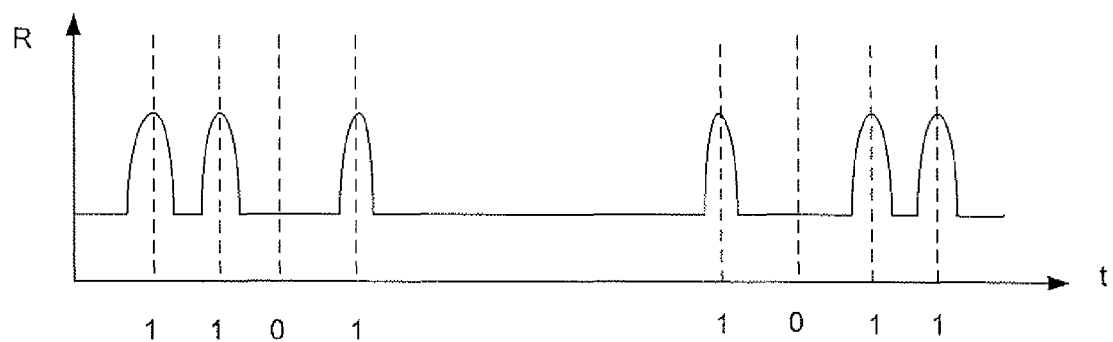
FIG. 10 is a graph representing two excitation signals sweeping different frequency ranges and the resulting resistance of the memory device.

For example, data may be stored on lower resonant frequency resonant members in one orientation, and higher resonant frequency resonant members in another orientation. Alternatively, two or more sets of data could be stored in the same orientation. An orthogonal memory device may, for example, store four sets of data (two sets in each direction). FIG. 10 illustrates the application of this principle to a memory device including a first group of resonant members having resonant frequencies in a first frequency range f1-f4 and a second group of resonant members having resonant frequencies in a second frequency range f4-f8. The two frequency ranges are non-overlapping. Applying a first excitation signal to the first frequency range enables the data string "1101" to be read whilst applying a second excitation signal to the second frequency range enables the data string "1011" to be read.

Interrogators may be configured to apply excitation signals to only particular frequency ranges in order to ensure that desired data is read. Restrictions in interrogator frequency range may also provide an extent of privacy for the owner of data stored at frequencies outside the restricted range.

Figure 11:
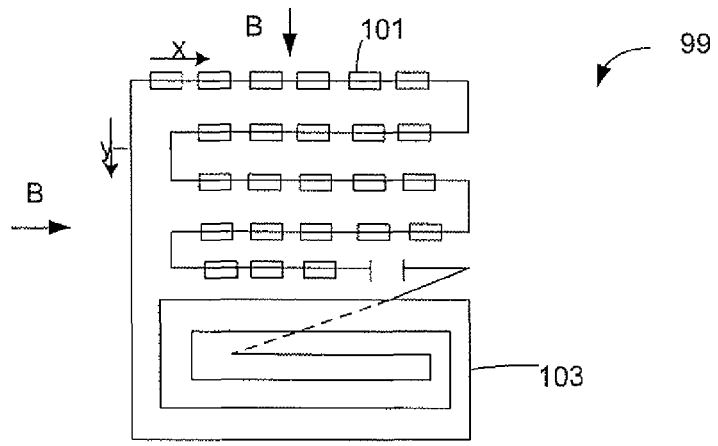
FIG. 11 is a schematic view of a memory device having resonant members on a common electrical conductor.

The encoding of different data in different frequency ranges is a not limited to the memory devices of FIGS. 4 to 9, and could be used with any memory device having an array of resonant members. The resonant members could be vibratable by a Lorentz force, or by an electrostatic, piezoelectric, magnetic or any other force. The resonant members need not extend in multiple directions, and need not have a common electrical conductor forming both conductor portions and a coupling element. By way of illustration, FIG. 11 shows an alternate memory device 99 that includes resonant members 101 extending in a single direction, and a separate coupling element 103. This memory device 99 could also be encoded with different data at different resonant frequencies.

A number of the above-described embodiments enable multiple sets of data to be stored or encoded in a memory device. However, interrogator of these various memory devices requires a specific orientation of the magnetic field direction with the direction in which one or more sets of resonant members extend. This alignment can prove difficult unless external alignment markers are provided on an object to which the memory device is affixed.

However, the Applicant has developed a technique for obtaining that specific orientation of magnetic field direction with respect to the direction(s) in which extend the resonant members on the memory device, without requiring such external alignment markers, as will be now explained.

Figure 12:
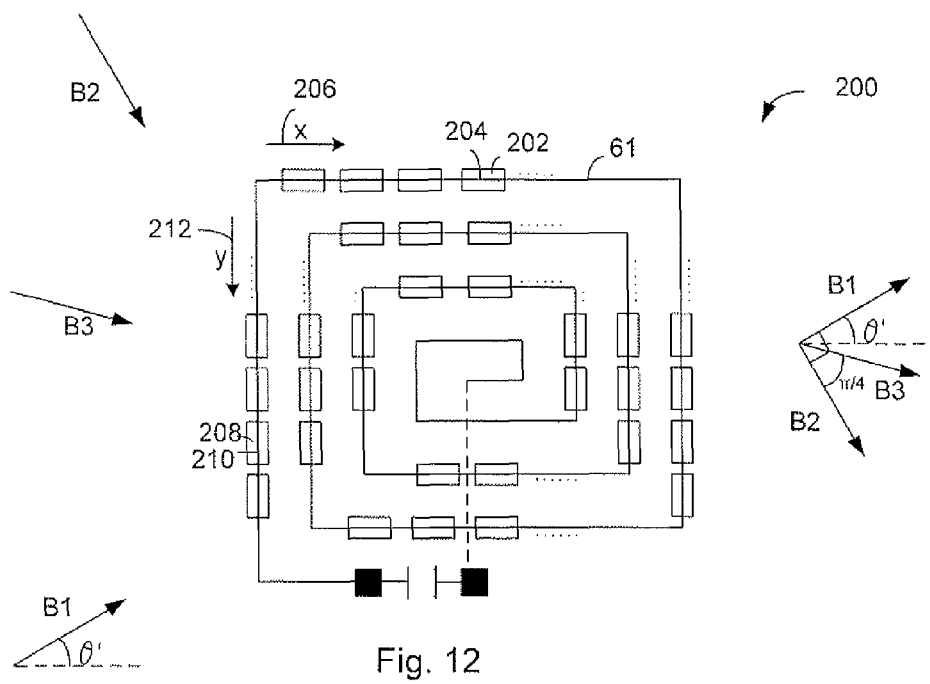
FIG. 12 is another schematic view of a memory device having orthogonal resonant members encoded with different data.

FIG. 12 shows a memory device 200 having first resonant members 202 with first conductor portions 204 extending in a first member direction 206 and second resonant members 208 with second conductor portions 210 extending in a second member direction 212.

Figure 13:
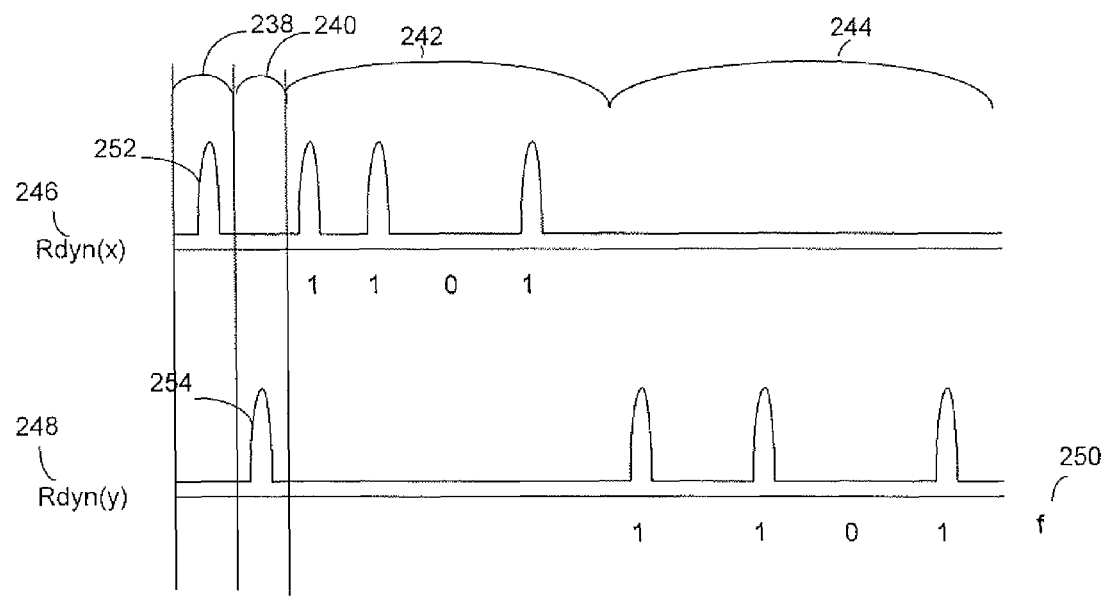
FIG. 13 is a graph showing the resistance response of a memory device having reference members when an excitation signal is applied across a frequency range.

The first and second resonant members come in this example, encode different sets of data. With reference to FIG. 13, the first resonant members 202 include a first group of members having resonant frequencies within a first pre-defined referenced band 242, whilst the second resonant members 208 include a first group of resonant members having resonant frequencies within a second predefined frequency band 244. The presence or absence of a resonant member of a particular frequency in each of the two predefined frequency bands 244 and 242 is equated to a logical "1" or "0" in order to encode data within each of those two predefined frequency bands.

Figure 14:
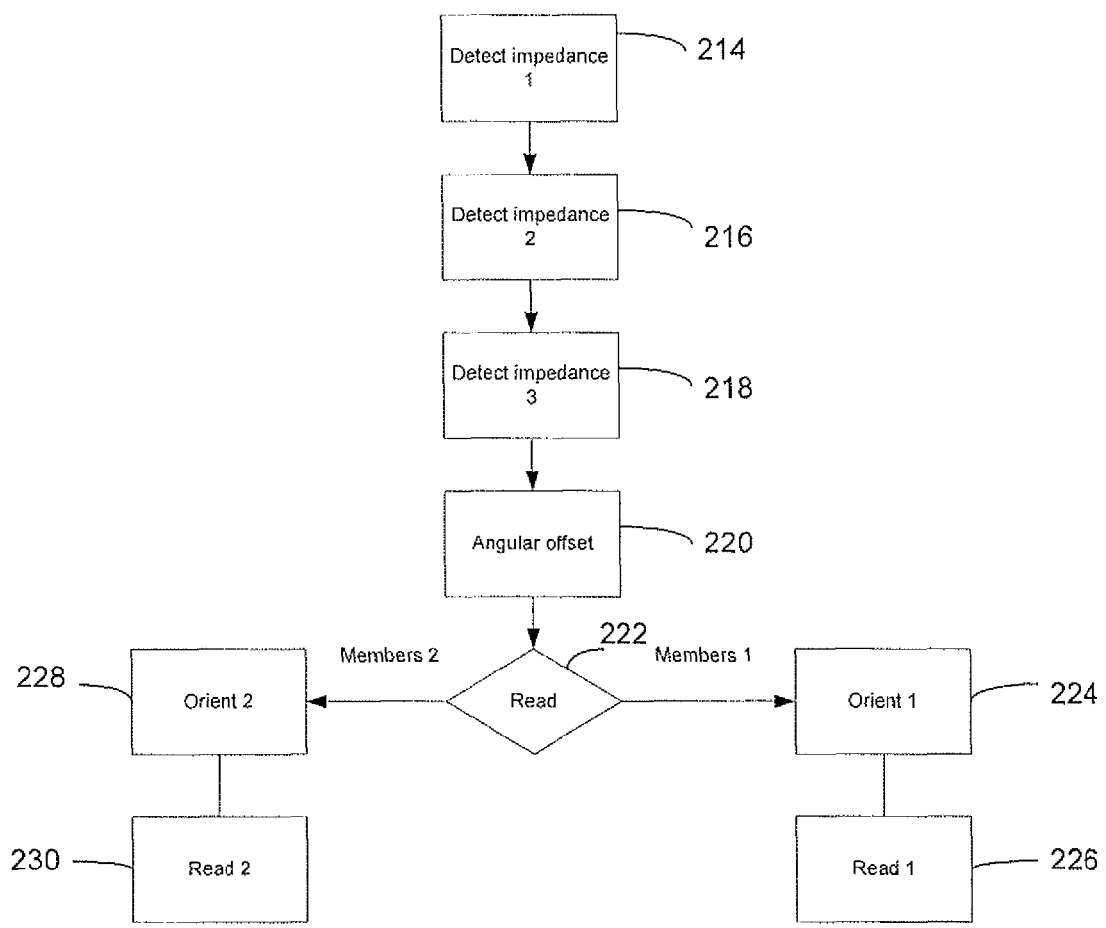
FIG. 14 is a flowchart of steps taken to orient and read the memory device of FIG. 11 in each member direction.

In order to determine the orientation of the first and second resonant members, and therefore read either or both of the sets of data encoded with the frequency bands 242 and 244, the memory device 200 is initially interrogated by a calibration excitation signal in three known magnetic field calibration directions B1, B2 and B3 to read three impedance values of the electrical equivalent circuit of the memory device at a selected frequencies at steps 214, 216 and 218 of FIG. 14.

In this illustrative example, the first calibration direction B1 is at a notional offset angle of θ' from the first member direction 204 in a plane containing the first and second conductor portions 204 and 210. The second calibration direction B2 is orthogonal to the first calibration direction B1 and in the same plane. The third calibration direction B3 bisects an angle between the first and second calibration directions B1 and B2. For example, B3 may be at an angle of π/4 radians from the first calibration direction B1.

When the magnetic field is aligned with the first calibration direction, the impedance $Z_A$ of the electrical equivalent circuit of the memory device 200 resulting from the mechanical response of the resonant members 202 and 208 at a particular frequency is given by:

$$Z_A(\theta') = Z_1 \cos^2(\theta') + Z_2 \sin^2(\theta'). \quad (1)$$

where $Z_1$, is the peak impedance contribution from the first resonant members 202 and $Z_2$ is the peak impedance contribution from the second resonant members 208.
At the second calibration direction, the impedance $Z_B$ is given by:

$$Z_B(\theta' + \pi/2) = Z_1 \sin^2(\theta) + Z_2 \cos^2(\theta') \quad (2)$$

At the third calibration direction $Z_C$, the impedance is given by:

$$Z_C(\theta' + \pi/4) = Z_1 \cos^2(\theta' + \pi/4) Z_2 \sin^2(\theta' + \pi/4). \quad (3)$$

In this case, $Z_A$, $Z_B$, $Z_C$ are measured, whereas θ', $Z_1$, $Z_2$ are unknown.
From Equations (1)+(2) it can be seen that $Z_A(\theta') + Z_B(\theta' + \pi/2) = Z_1 + Z_2$. (4)

It can also be seen that $\cos(\theta' + \pi/4) = \cos\theta' \cos \pi/4 - \sin\theta' \sin \pi/4;$ $\cos(\theta' + \pi/4) = 1/\sqrt{2}(\cos\theta - \sin\theta');$ and $\cos^2(\theta' + \pi/4) = (1/\sqrt{2})^2(\cos^2\theta' + \sin^2\theta' - 2\cos\theta' \sin\theta')$ $\cos^2(\theta' + \pi/4) = \frac{1}{2}(1 - 2\cos\theta' \sin\theta').$ (5)

Similarly, it can be seen that $\sin(\theta' + \pi/4) = \sin\theta' \cos \pi/4 + \cos\theta' \sin \pi/4;$ $\sin(\theta' + \pi/4) = 1/\sqrt{2}(\sin\theta' + \cos\theta');$ $\sin^2(\theta' + \pi/4) = \frac{1}{2}(\sin^2\theta' + \cos^2\theta' + 2\cos\theta' \sin\theta');$ and $\sin^2(\theta' + \pi/4) = \frac{1}{2}(1 + 2\cos\theta' \sin\theta')$ (6)

By substituting equations (5) and (6) into (3), it can be seen that $$Z_c\left(\theta' + \frac{\pi}{4}\right) = Z_1 \frac{1}{2}(1 - 2\cos\theta'\sin\theta') + Z_2 \frac{1}{2}(1 + 2\cos\theta'\sin\theta')$$
$$= \frac{Z_1}{2} - Z_1\cos\theta'\sin\theta' + \frac{Z_2}{2} + Z_2\cos\theta'\sin\theta'.$$

This equation reduces to $$Z_C(\theta'+\pi/4)=\tfrac{1}{2}(Z_1+Z_2)-\cos\theta'\sin\theta'(Z_1+Z_2)=\tfrac{1}{2}(Z_1+Z_2)-\cos\theta'\cos(\pi/2-\theta')(Z_1+Z_2)$$

From which is derived $$Z_C(\theta'+\pi/4)=(Z_1+Z_2)(\tfrac{1}{2}-\cos\theta'\cos(\pi/2-\theta')) \quad (7)$$

where $Z_C$ is measured, and $Z_1+Z_2=Z_A+Z_B$ (since the first and second resonant members extend in orthogonal directions).

Since the only unknown is $\theta'$, equation (7) can be solved in order to determine the offset angle $\theta'$ of the first calibration direction from the direction in which the first or second resonant members extend. Once $\theta'$ is solved, $Z_1$ and $Z_2$ can be found using Equations (4), (1) and (2).

The above development of equations (1) to (7) therefore enables the two different data sets encoded in the first and second resonant members 202 and 208 to be singularised through computation in the Analyser 24 alone. In other words, by computing the values of $Z_1$ and $Z_2$ across all desired frequencies in the predetermined frequency bands 242 and 244, both sets of data can be isolated.

Alternatively, computation of the offset angle $\theta'$ can be used to re-orient the magnetic field direction to be perpendicular to one of the first or second resonant members in order to read only the data encoded in that group of resonant members.

It will be appreciated that the above-described example can be generalised to read data recorded on a memory device including N arrays of one or more resonant members, where the resonant members in each array extending in a common direction which is different from the common direction in which resonant members in other arrays extend. In one generalised case, for each of at least N+1 calibration directions in a plane containing the resonant members, a magnetic field is applied across the resonant members in that direction, at least a first excitation signal is applied to the memory device, at least a first response is received to the excitation signal, and the response is analysed in order to detect changes in the impedance of the electrical equivalent circuit of the memory device. Thereafter, the angular offset between a first calibration direction and the common direction of a first array from the detected changes in impedance is determined, and the magnetic field re-oriented so as to selectively read data encoded in one of the resonant arrays.

It will also be appreciated that the above analysis, and generalisations thereof, may be generalised to lift the implicit assumption that the magnetic field strength in the three measurement direction B1, B2 and B3 is the same.

In another generalised case, the impedance change caused by resonant members in each array, when the magnetic field is oriented perpendicularly to the common direction in which those resonant members extend, is directly computed from the detected changes in impedance.

At step 222, a choice is made to read either the first resonant members 202 or second resonant members 208. If the first resonant members 202 are to be read, at step 224 the angular offset $\theta'$ is used to orthogonally orient the magnetic field direction relative to first member direction 206. The first resonant members 202 are then read at step 226 by applying a reading excitation signal to the memory device, receiving a response to the reading excitation signal and analysing the response in order to detect changes in the impedance of the memory device.

If the second resonant members 208 are to be read, at step 228, the angular offset $\theta'$ is used to orthogonally orient the magnetic field direction relative to second member direction 212 and then the second resonant members 208 are read at step 230 in a similar manner to reading the first resonant members.

It will be appreciated that after reading the resonant members in one of either the first or second directions 206 or 212, the magnetic field and/or memory device could be rotated so that the magnetic field is oriented orthogonally to the other of the first or second resonant members 202 or 208, in order to read the other resonant members.

To assist in orienting the memory device, one or more resonant members may be reference members having a resonant frequency within a predefined reference frequency band. For example, one of the first resonant members and one of the second resonant members may be reference members. The calibration excitation signal may then be applied across the reference frequency band and the selected frequency may be within the reference frequency band. The reference frequency band may be a small band compared with the frequency range of the entire memory device.

The reference members may be used to indicate that data is stored in a second predefined frequency band on the memory device. As shown in FIG. 13, two predefined reference frequency bands 238 and 240 are defined, and respectively indicate the presence of data in the predefined frequency bands 242 and 244.

Figure 15:
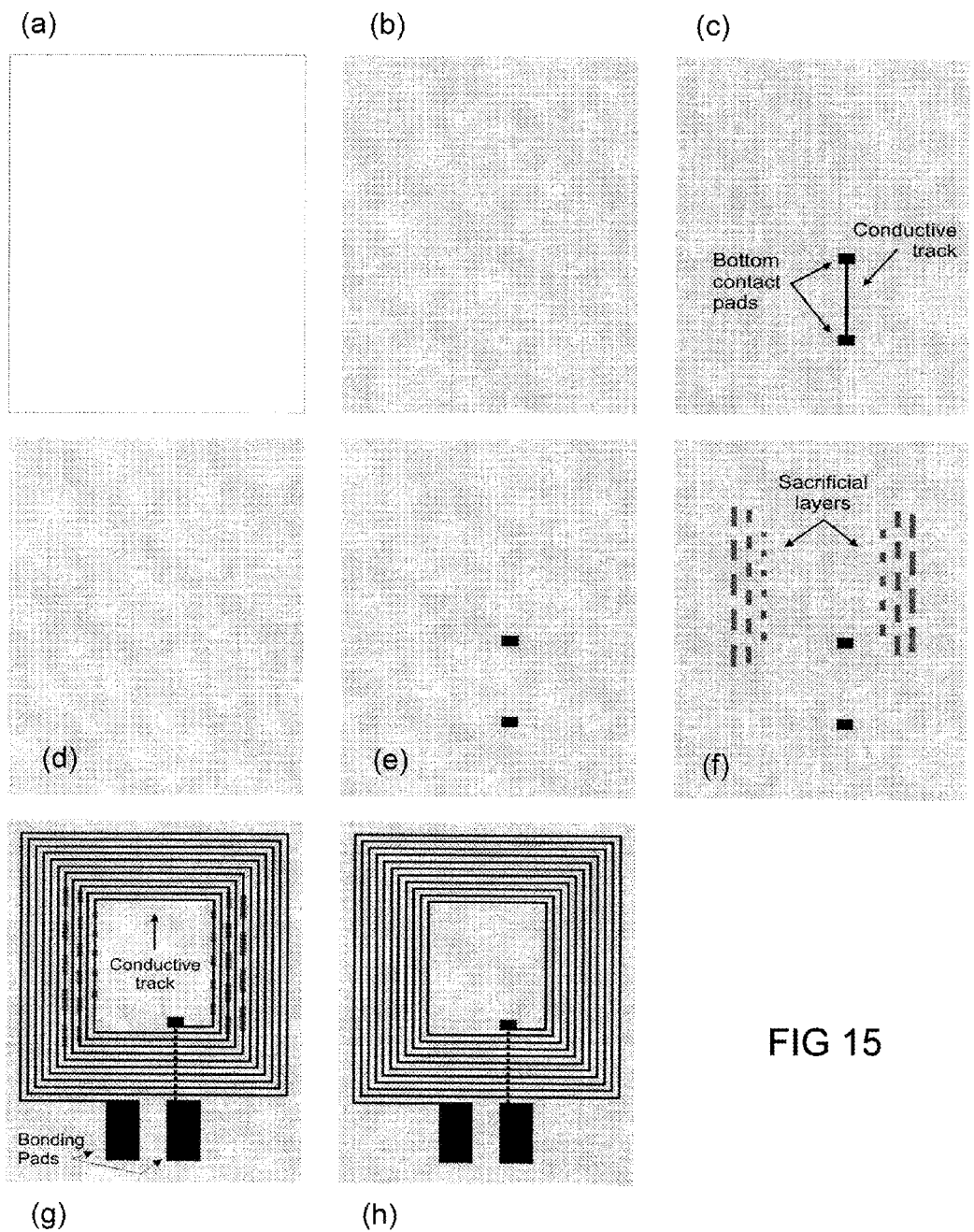
FIG. 15($a$) to FIG. 15($h$) is a fabrication method for manufacturing a memory device.

The above-described memory devices can be fabricated using MEMS or CMOS technology, and the excitation circuitry and resonant members can be formed on the same dielectric or semiconductor substrate. One MEMS fabrication method for manufacturing memory devices is shown in FIGS. 15(a) to 15(h). Referring to FIG. 15(a), the process is started with a clean wafer, for example single crystal silicon. An conformal insulating layer (e.g. silicon oxide) is then deposited onto the wafer as shown in FIG. 15(b). A bottom conductive layer (e.g. aluminium), is deposited onto the wafer. This layer is patterned into the shape of a conductive track having two contact pads as shown in FIG. 15(c). Another conformal insulating layer (e.g. silicon oxide) is then deposited onto the wafer as shown in FIG. 15(d). The insulating layer is etched in specific areas to expose the contact pads of the bottom conductive layer as shown in FIG. 15(e). Etching of the insulating layer can be a wet or dry process. A sacrificial layer is then deposited and patterned onto the wafer as shown in FIG. 15(f). The patterning of this layer defines the shape of the resonant members.

A top conductive layer (e.g. aluminium) is then deposited onto the wafer, patterned into the shape of a coil as shown in FIG. 15(g). This layer is aligned such that parts of the coil will run directly over the patterned sacrificial layer. Bonding pads are also deposited onto the wafer. One end of the coil (at the centre) is in contact with one of the contact pads. The other end of the coil is in contact with one of the bonding pads. The other contact pad is in contact with the other bonding pad. The dotted line in FIG. 15(g) represents the bottom conducting track. As shown in FIG. 16(h), the patterned sacrificial layer is then removed via a wet or dry etch process. A capacitor could be added to the memory device during the manufacture process or separately mounted on the memory device post manufacture. It will be appreciated that other materials and techniques could be used to manufacture the memory devices.

Figure 16:
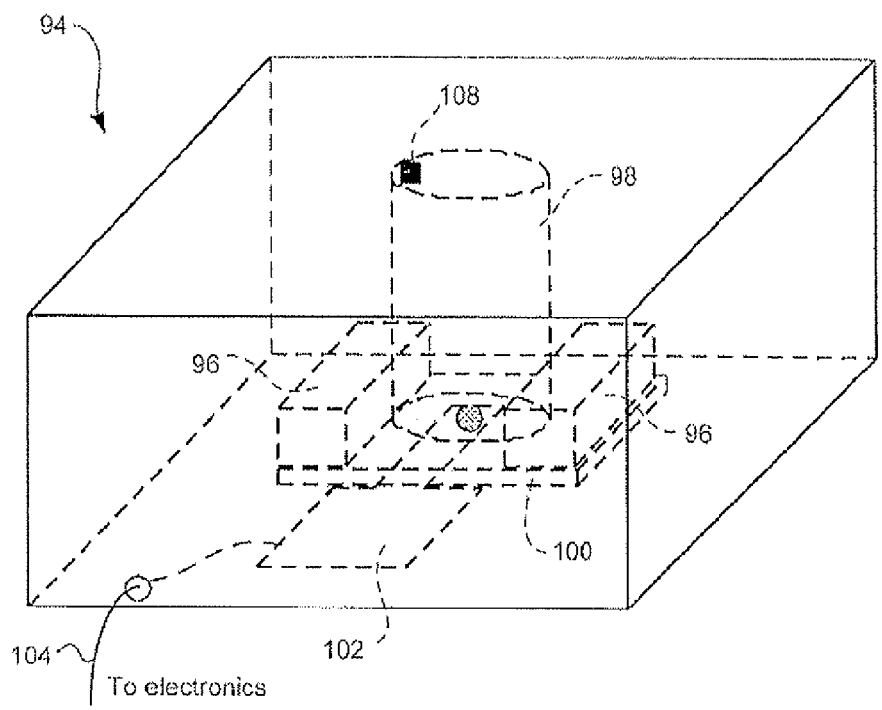
FIG. 16 is a perspective view of an interrogator having permanent and soft magnets.
Figure 17:
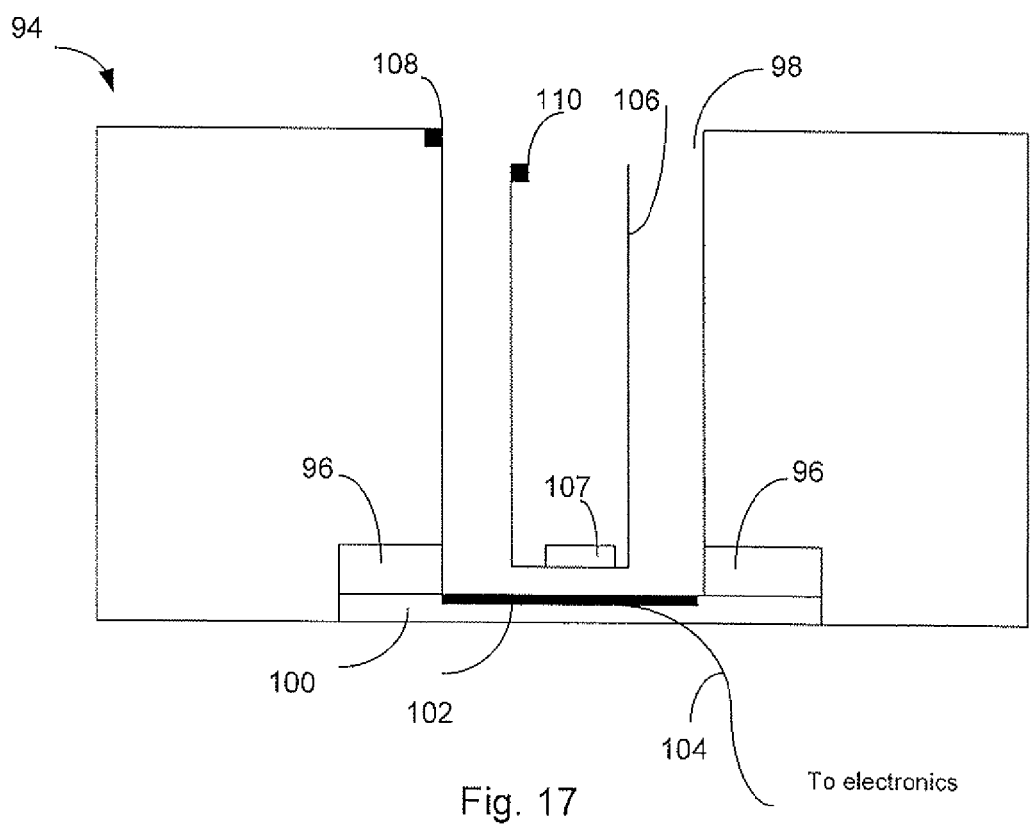
FIG. 17 is a side view of the interrogator of FIG. 17 with a vial having a memory device placed in the interrogator.

FIGS. 16 to 27 show different interrogators that can be used to read the memory device. FIG. 16 is a perspective view and FIG. 17 is a corresponding side view of an interrogator 94 having two permanent magnets 96 positioned on either side of an inlet hole 98 and a soft magnet return 100 connecting the two permanent magnets 96. An antenna 102 sits below the inlet hole 98 and is connected to analyser 24 and microcomputer 26 by a connector 104. This connector 104 may be hard wired or wireless.

FIG. 17 shows a vial 106 inserted in the inlet hole 98 of the interrogator 94, the vial 106 including a memory device 107 which is oriented horizontally in the vial 106. A magnetic field is applied across the resonant members of the memory device 107 by the permanent magnets 96, such that the resonant members on the memory device 107 (unless parallel to the magnetic field) will vibrate when an alternating current is induced in their conductor portions. The vibration of the resonant members causes a change in the impedance of the electrical equivalent circuit of the memory device 107. This impedance peaks when the frequency of the alternating current corresponds to the resonant frequency of the resonant members. The resistance of the memory device is detected via the coupling element 102. Data stored on the device can be read in accordance with the above described methods.

This interrogator 94 is suitable for reading a multi-directional memory device that has the same data stored in all directions. However, it can also be used for reading a multi-directional memory device storing different data sets, or memory devices that are not multi-directional.

An orientation marker 108 on the inlet hole 98 and corresponding orientation marker 110 on the vial 106 may be used to assist in aligning the memory device 107 with respect to the magnets 96 in the case where the memory device 107 stores more than one data set.

Alternatively or additionally, the permanent magnets 96 may be rotatable so as to apply a magnetic field in at least the three calibration directions B1, B2 and B3. As described previously, the data encoded in the first and second resonant members can be computed from impedance measurements taken when the magnetic field is applied in these three directions, or alternatively the calculated offset angle θ' can be used to reorient the magnetic filed to read data encoded in a desired set of resonance members only.

Figure 18:
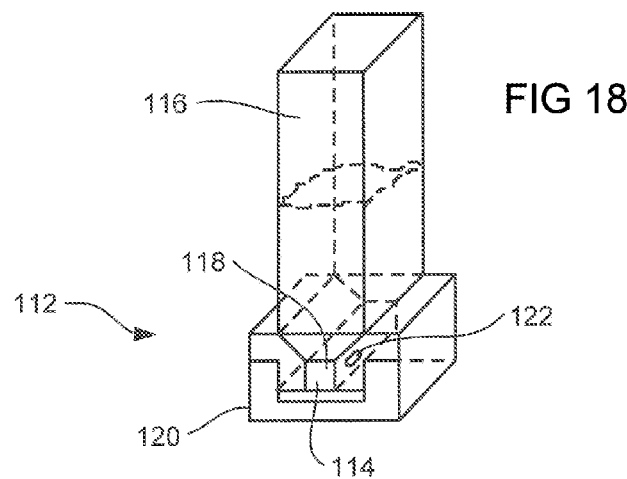
FIG. 18 is a perspective view of an interrogator having a recess and a vial having a shaped base such that the vial fits into the recess in one orientation.

FIG. 18 shows an interrogator 112 that is suitable in situations where it is desired to always read data stored in one orientation on a multi-directional memory device. The interrogator 112 has a rectangular shaped recess 114 in which a vial 116 with a corresponding rectangular shaped base 118 is positioned. The interrogator 112 also includes a magnetic field generator 120 which applies a magnetic field across the recess 114. The recess 114 and base 118 are shaped such that vial 116 fits into the recess 114 in only one orientation (a rotation of 180 degrees is considered to be the same orientation). A memory device 122 is encapsulated in the vial 116 in an orientation such that when the vial 116 is inserted in the recess 114 either first resonant members or second resonant members in the memory device 122 are perpendicular to the magnetic field across the recess 114.

Figure 19:
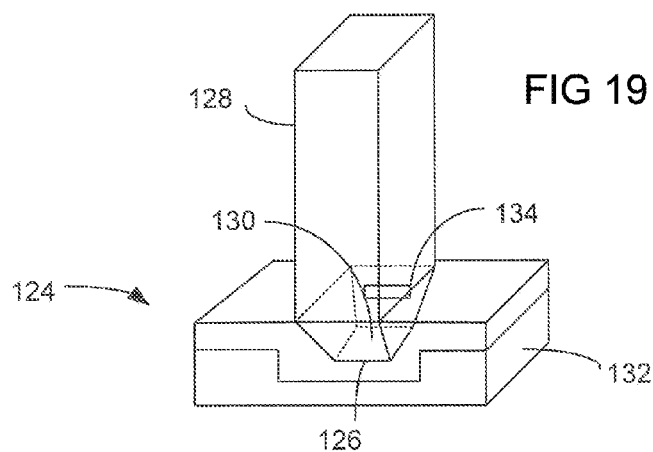
FIG. 19 is a perspective view of an interrogator having a recess and a vial having a shaped base such that the vial fits into the recess in two orientations.

FIG. 19 shows an interrogator 124 that is suitable in situations where it is desired to read data stored in two orientations on a memory device. The interrogator 124 has a square shaped recess 126 in which a vial 128 with a corresponding square shaped base 130 is positioned. The interrogator 124 includes a magnet 132 which applies a magnetic field across the recess 126. As can be seen, the recess 126 and base 130 are shaped such that the vial 128 having a memory device 134 fits into the recess 126 in two orthogonal orientations. An identification marker on the vial 128 may be used to show which direction resonant members on the memory device 134 are being read.

Figure 20:
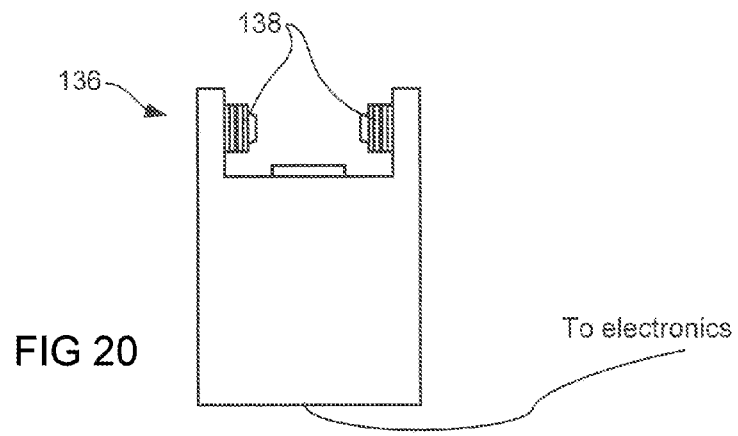
FIG. 20 is a side view of an interrogator having two electromagnets.

FIG. 20 shows an alternate interrogator 136 using electromagnets 138. The electromagnets 138 could be energised at the time of applying the excitation signal to the memory device, or could be left on continuously. The magnetic field lines could run horizontally, between two electromagnets 138, as shown in FIG. 16. In another alternative, one electromagnet could be used, and the magnetic field lines could run vertically up from the top of the electromagnet. In yet another alternative, an electromagnet may be configured to apply a magnetic field in at least the three calibration directions B1, B2 and B3.

Figure 21:
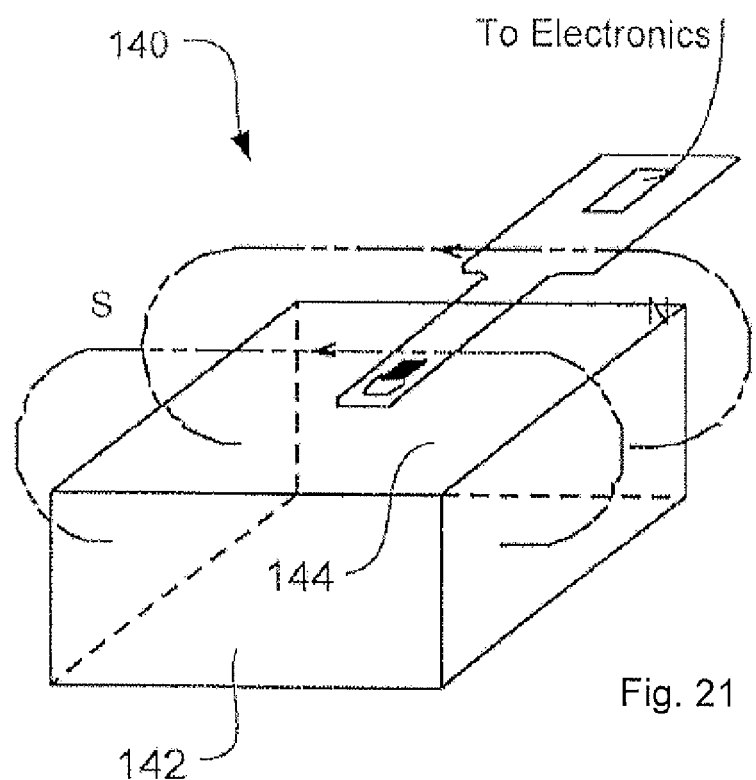
FIG. 21 is a perspective view of an interrogator having a single magnet.
Figure 22:
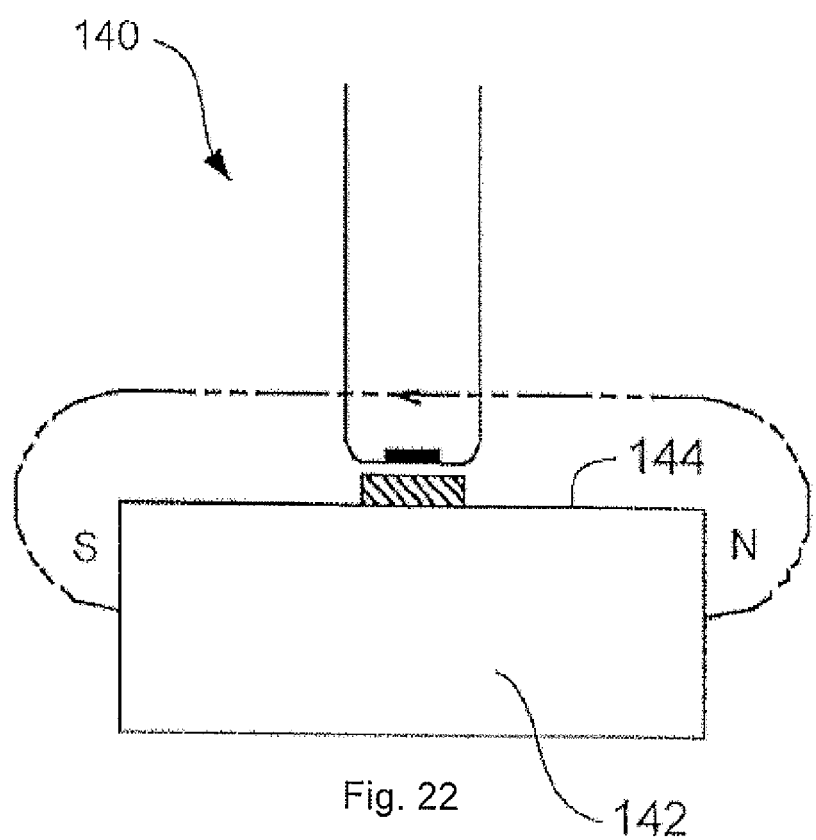
FIG. 22 is a side view of the interrogator of FIG. 21.

An interrogator 140 using a single magnet 142 is shown in perspective in FIG. 21 and from a side view in FIG. 22. Magnetic field lines run across the surface 144 of the magnet 142 and a memory device can be read by positioning it on the surface 144 of the magnet 142. The single magnet 142 may have a stronger magnetic field strength than the permanent and soft magnets of FIGS. 16 to 20.

Figure 23:
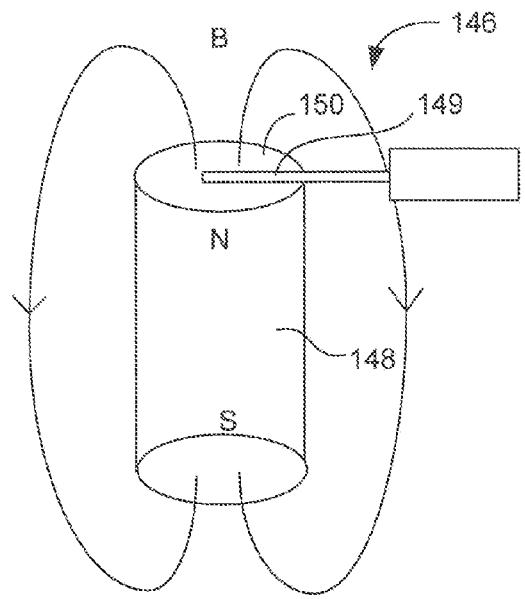
FIG. 23 is a perspective view of an interrogator having a cylindrical magnet.
Figure 24:
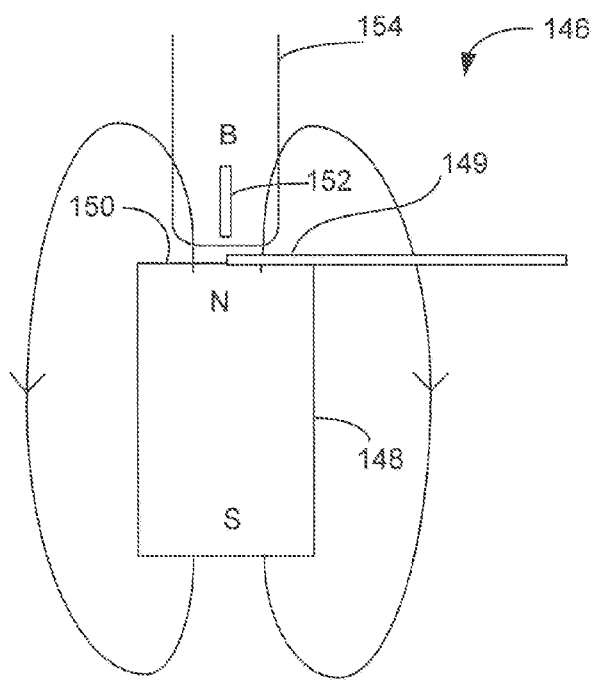
FIG. 24 is a side view of the interrogator of FIG. 23.

An alternate interrogator 146 using a single magnet 148 is shown in perspective in FIG. 23 and from a side view in FIG. 24. The magnet 148 has a cylindrical shape, and magnetic field lines run upwards from the surface 150 of magnet 148. An antenna 149 sits on top of the magnet 148. The single magnet 148 could be a permanent magnet or an electromagnet.

To enable data to be read from one orientation, a memory device 152 having data stored in more than one orientation can be positioned vertically in a vial 154, such that placing the vial 154 vertically above the surface 150 of the magnet 148 enables the data stored in one orientation to be read. The data stored in that orientation could be read even if the vial 154 was rotated about its longitudinal axis.

Figure 25:
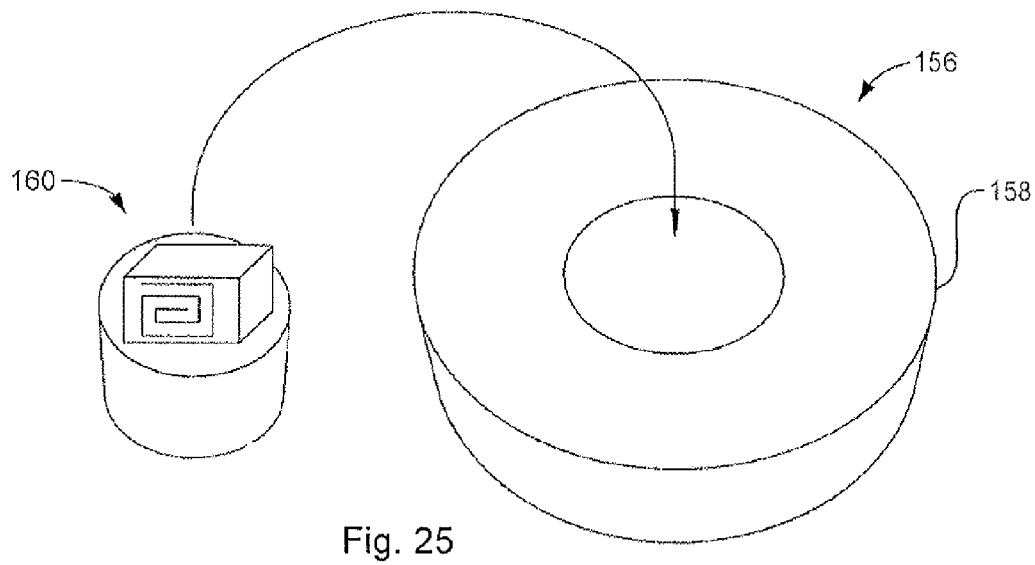
FIG. 25 is a perspective view of a memory device and annular magnet.
Figure 26:
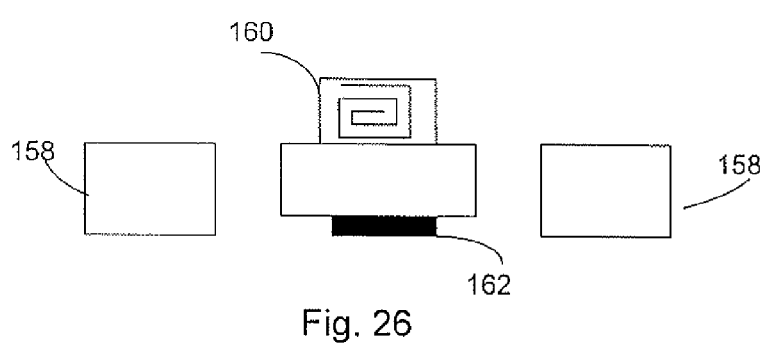
FIG. 26 is a side view of the memory device placed in the hole of the annular magnet.

FIG. 25 is a perspective view and FIG. 26 is a corresponding side view of an interrogator 156 having an annular magnet 158. The magnetic field strength is concentrated in the hole of the annular magnet 158, with magnetic field lines extending into the hole. A memory device 160 can be placed into the hole of the magnet and interrogated by an antenna 162. The memory device 160 can be oriented vertically, to vibrate resonant members in one direction, or horizontally, to vibrate all of the resonant members.

Figure 27:
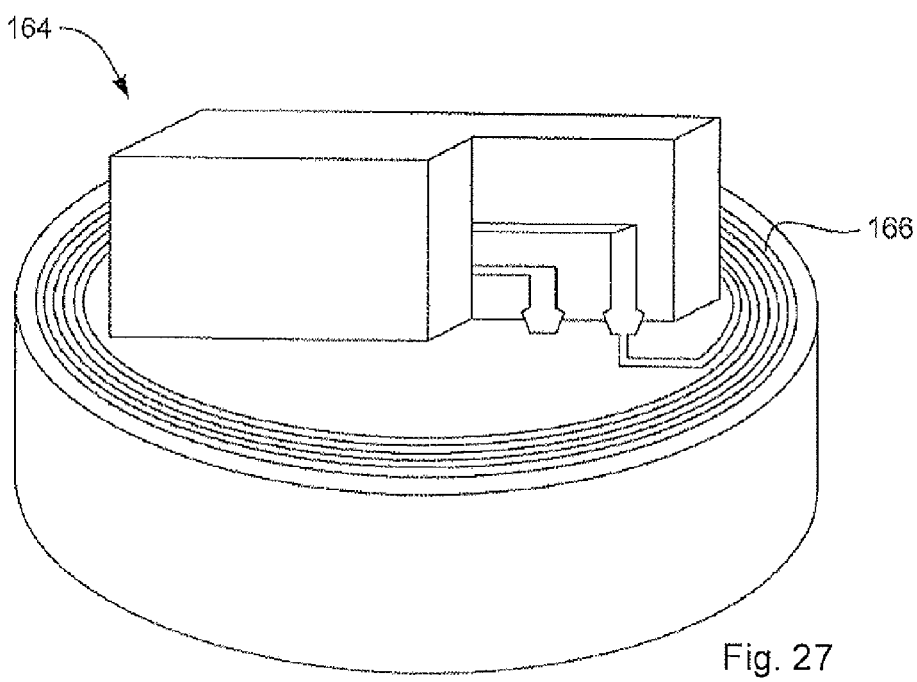
FIG. 27 is a perspective view of a memory device with an external antenna.

FIG. 27 shows a memory device 164 having an external electrodynamic coupling element 166. This memory device 164 is suitable for use with the interrogator 146 of FIGS. 24 and 25. The memory device 164 could be encapsulated vertically in an item and interrogated in a rotational independent manner, as shown in FIG. 25. Regardless of rotation of the item about its longitudinal axis, the external antenna 166 is parallel to and couples with the interrogator antenna 149 and the magnetic field lines are perpendicular to the same resonant members of the memory device 164 (the resonant members that are parallel to the surface 150 of the interrogator 146).

Other variations of interrogator are of course possible. It will be appreciated that combinations of magnet shape and position within an interrogator and memory device orientation within an item can be used as appropriate to achieve the desired reading capability. Examples of reading capabilities include—always reading the data stored in one direction, always reading the data stored in all orientations, separately reading data stored in different orientations and rotational independence for appropriate antenna, resonant member orientation and magnetic field orientation.

It is to be understood that various alterations, additions and/or modifications may be made to the parts previously described without departing from the ambit of the present invention, and that, in light of the teachings of the present invention, the memory device may be implemented in a variety of manners as would be understood by the skilled person.

The invention claimed is:

1. A memory device including:
   a first array of one or more first resonant members extending in a first member direction; a second array of one or more second resonant members extending in a second member direction, wherein the first resonant members encode either the same or different data than the second resonant members; and
   one or more elements for transforming energy associated with vibration of the first and second resonant members into a change in impedance of an electrical equivalent circuit of the memory device said vibration caused by a magnetic field applied from external of the memory device,
   such that the magnitude of the impedance change caused by resonance of the first resonant members is maximized at a different magnetic field direction of said magnetic field to that at which the magnitude of the impedance change caused by resonance of the second resonant members is maximized.

2. The memory device of claim 1, wherein the one or more elements include first conductor portions each extending along the length of a first resonant member and second conductor portion extending along the length of the second resonant member.

3. The memory device of claim 2, wherein one or more of the first and second conductor portions are integral with one or more of the first and second resonant members.

4. The memory device of claim 2, wherein one or more of the first and second conductor portions are formed on one or more of the first and second resonant members.

5. The memory device of claim 1, wherein the resonant members are vibratable by application of a Lorentz force.

6. The memory device of claim 1, wherein the first member direction and second member direction are non-collinear.

7. The memory device of claim 6, wherein the first member direction and second member direction are orthogonal to each other.

8. The memory device of claim 1, wherein the first resonant members encode different data than the second resonant members.

9. The memory device of claim 1, wherein the first resonant members encode the same data as the second resonant members.

10. The memory device of claim 1, wherein the one or more elements form part of a common electrical conductor connected to a coupling element for coupling with the applied excitation signal.

11. The memory device of claim 1, wherein the one or more elements form part of a coupling element for coupling with the applied excitation signal.

12. The memory device of claim 1, wherein the memory device is fabricated using MEMS or CMOS technology.

13. The memory device of claim 12, wherein the first and second resonant members and the common electrical conductor are formed on the same dielectric or semiconductor substrate.

14. The memory device of claim 13, wherein a coupling element for coupling with the applied excitation signal is also formed on the same dielectric or semiconductor substrate.

15. The memory device of claim 1, wherein a first group of one or more first and/or second resonant members have resonant frequencies within a first frequency range; and a second group of one or more first and/or second resonant members have resonant frequencies within a second frequency range, the first group encoding different data than the second group.

16. The memory device of claim 1, wherein a first group of one or more first and/or second resonant members have resonant frequencies within a first frequency range; and a second group of one or more first and/or second resonant members have resonant frequencies within a second frequency range, the first group encoding the same data as the second group.

17. The memory device of either one of claim 15 or 16, wherein the first frequency range and the second frequency range are non-overlapping.

18. An interrogator for interrogating the memory device of claim 1, the interrogator including
   a signal generator for applying an excitation signal to the memory device;
   a magnetic field generator for applying a magnetic field across the resonant members; and
   a receiver for receiving a response to the excitation signal and for analyzing the response in order to detect changes in a magnitude indicative of the vibration of the resonant members of the memory device.

19. The interrogator of claim 18, wherein the magnetic field generator includes one or more electromagnets for applying the magnetic field.

20. The interrogator of claim 19, wherein the electromagnet is configured to apply a magnetic field in at least three different directions.

21. The interrogator of claim 18, wherein the magnetic field generator includes one or more permanent magnets and/or soft magnets for applying the magnetic field.

22. The interrogator of claim 21, wherein the one or more permanent magnets are rotatable so as to apply a magnetic field in at least three different calibration directions.

23. The interrogator of claim 21, wherein the permanent magnet has an annular shape.

24. The interrogator of claim 18, wherein the interrogator has a recess in which an item including the memory device is positioned for reading the memory device.

25. The interrogator of claim 24, wherein the recess and item are shaped such that the item fits into the recess in one orientation.

26. The interrogator of claim 24, wherein the recess and item are shaped such that the item fits into the recess in two, three or four orientations.

27. A method of reading data recorded on the memory device of claim 1, including the steps of:
   applying a magnetic field across the resonant members in a first magnetic field direction;
   applying at least a first excitation signal to the memory device;
   receiving at least a first response to the first excitation signal, and
   analyzing the first response in order to detect changes in the impedance of the electrical equivalent circuit of the memory device.

28. The method of claim 27, further including the steps of:
   applying a magnetic field across the resonant members in a second magnetic field direction;
   applying at least a second excitation signals to the memory device;
   receiving at least a second response to the second excitation signal, and
   analyzing the second response in order to detect changes in the impedance of the electrical equivalent circuit of the memory device.

29. A method of reading data recorded on a memory device, the memory device including N arrays of one or more resonant members, the resonant members in each array extending in a common direction which is different from the common direction in which resonant members in other arrays extend, the method including the steps of:
(a) for each of at least N+1 calibration directions in a plane containing the resonant members:
  (i) applying a magnetic field across the resonant members in that direction,
  (ii) applying at least a first excitation signal to the memory device,
  (iii) receiving at least a first response to the excitation signal, and
  (iv) analyzing the response in order to detect changes in the impedance of the electrical equivalent circuit of the memory device,
(b) determining the angular offset between a first calibration direction and the common direction of a first array from the detected changes in impedance, and
(c) re-orienting the magnetic field so as to selectively read data encoded in one of the resonant arrays.

30. A method of reading data recorded on a memory device, the memory device including N arrays of one or more resonant members, the resonant members in each array extending in a common direction which is different from the common direction in which resonant members in other arrays extend, the method including the steps of:
(a) for each of at least N+1 calibration directions in a plane containing the resonant members:
  (i) applying a magnetic field across the resonant members in that direction,
  (ii) applying at least a first excitation signal to the memory device,
  (iii) receiving at least a first response to the excitation signal, and
  (iv) analyzing the response in order to detect changes in the impedance of the electrical equivalent circuit of the memory device,
(b) computing the impedance change caused by resonant members in each array, when the magnetic field is oriented perpendicularly to the common direction in which those resonant members extend, from the detected changes in impedance.

31. The method of either one of claim 29 or 30, wherein there are two arrays of resonant members and the calibration directions include a first calibration direction, a second calibration direction orthogonal to the first calibration direction and a third calibration direction bisecting an angle between the first and second calibration directions.

32. The method of claim 31, wherein
one or more resonant members in each array are reference members having a resonant frequency within one of a range of selected frequency bands.

33. The method of claim 32, wherein
a resonant member in each of the N arrays of resonant members has a resonant frequency within a different selected frequency band.

34. The memory device of claim 1, wherein one or more resonant members are reference members having a resonant frequency within one of a range of selected frequency bands.

35. The memory device of claim 34, wherein one of the first resonant members and one of the second resonant members are reference members and each of these resonant members has a resonant frequency within a different selected frequency band.

36. The memory device of claim 34, wherein for each resonant member that is a reference member, there are one or more resonant members extending in the same member direction as the reference member within a second predefined frequency band.

* * * * *